(12) United States Patent
Nakagata

(10) Patent No.: US 9,425,830 B2
(45) Date of Patent: Aug. 23, 2016

(54) ERROR DETECTION DEVICE AND ERROR DETECTING METHOD

(71) Applicant: FUJITSU LIMITED, Kawasaki-shi, Kanagawa (JP)

(72) Inventor: Shohei Nakagata, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 74 days.

(21) Appl. No.: 14/604,933

(22) Filed: Jan. 26, 2015

(65) Prior Publication Data

US 2015/0256206 A1    Sep. 10, 2015

(30) Foreign Application Priority Data

Mar. 20, 2014    (JP) ................. 2014-044414

(51) Int. Cl.
  *H03M 13/00*    (2006.01)
  *H03M 13/37*    (2006.01)
  *H04L 1/00*    (2006.01)
  *H04L 1/08*    (2006.01)

(52) U.S. Cl.
  CPC ......... *H03M 13/3738* (2013.01); *H04L 1/0047* (2013.01); *H04L 1/08* (2013.01)

(58) Field of Classification Search
  CPC ... H03M 13/3738; H04L 1/08; H04L 1/0047; H04L 9/3226; H04L 2209/608; G10L 19/018; G06T 1/0021; H04N 2201/3236; H04N 2201/324; H04N 2201/3284; H04N 1/32149
  See application file for complete search history.

(56) References Cited

U.S. PATENT DOCUMENTS 5,757,824 A    5/1998 Arai et al.

FOREIGN PATENT DOCUMENTS

| JP | 4-3525 | 1/1992 |
| JP | 5-6631 | 1/1993 |

*Primary Examiner* — Guerrier Merant
(74) *Attorney, Agent, or Firm* — Fujitsu Patent Center

(57) ABSTRACT

An error detection method includes: generating an input code sequence from a signal that repeatedly transmits a code sequence including data, an error detection code, and an error correction code; generating a decoding-target code sequence including recovered data, an error detection code, and an error correction code from the input code sequence; generating a corrected code sequence by executing an error correction process that uses the error correction code in the decoding-target code sequence on the decoding-target code sequence; deciding whether the recovered data in the corrected code sequence includes an error by using the error detection code in the decoding-target code sequence; generating a reference code sequence by adding to the corrected code sequence a corresponding error correction code; and verifying whether a decision result for the recovered data is correct according to a comparison result between the reference code sequence and the input code sequence.

8 Claims, 18 Drawing Sheets

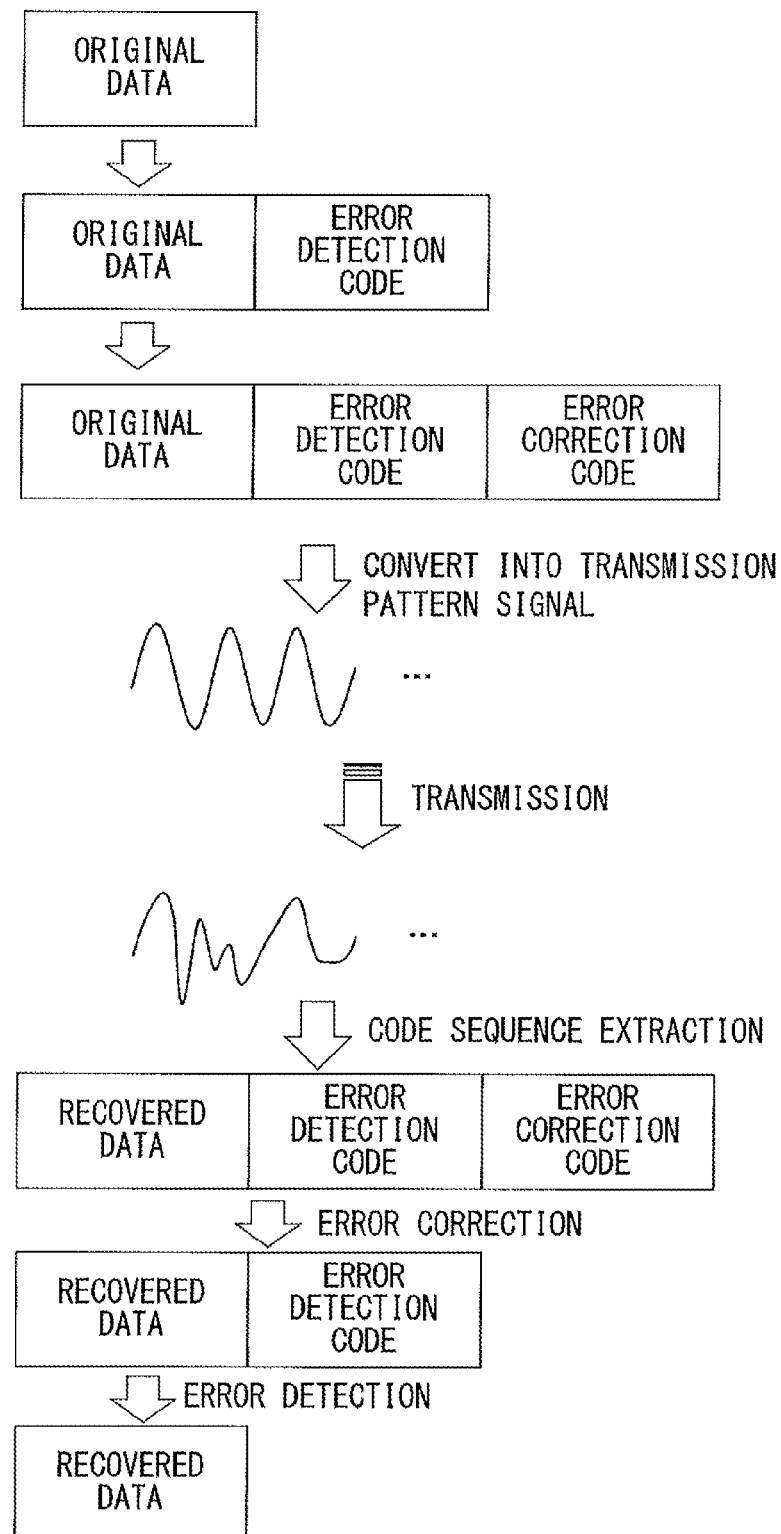
F I G. 1

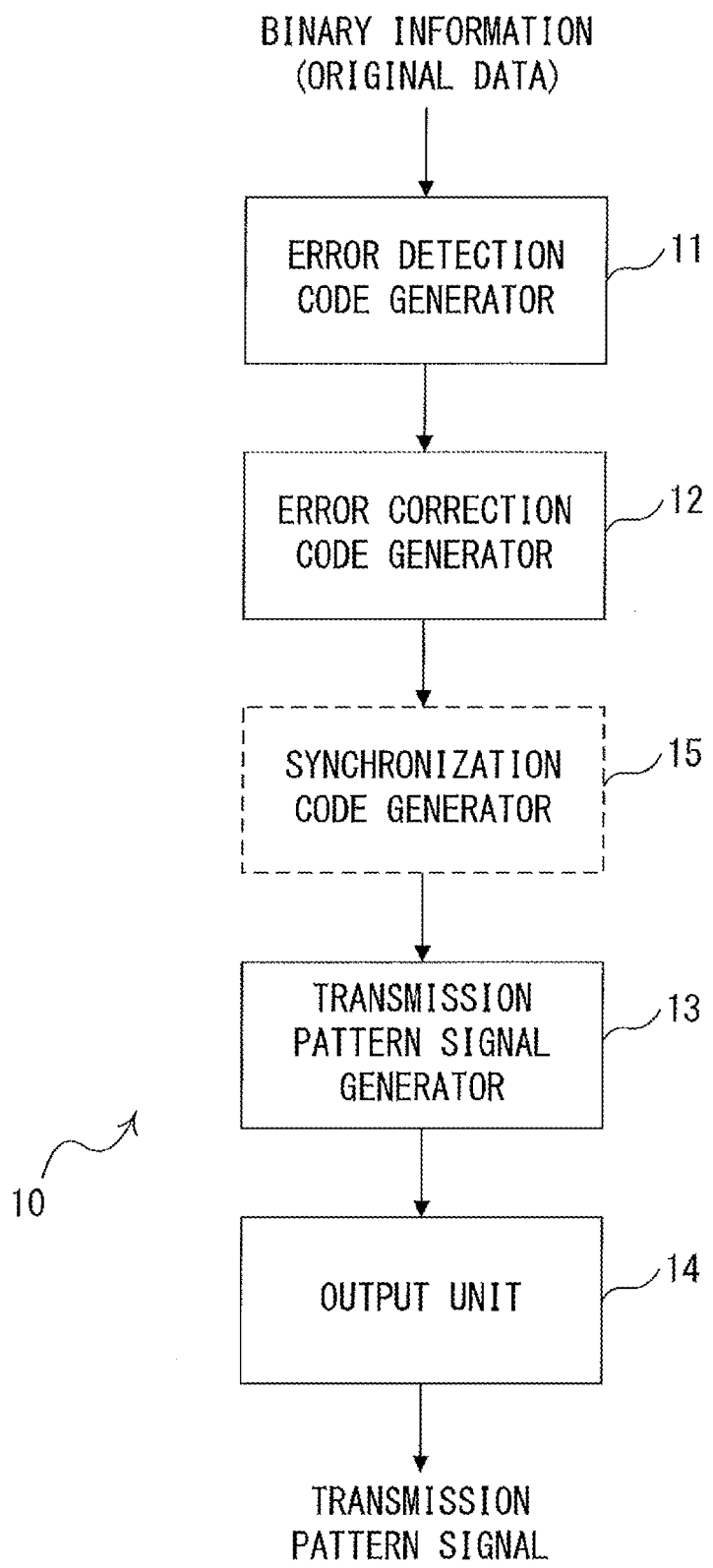
F I G. 2

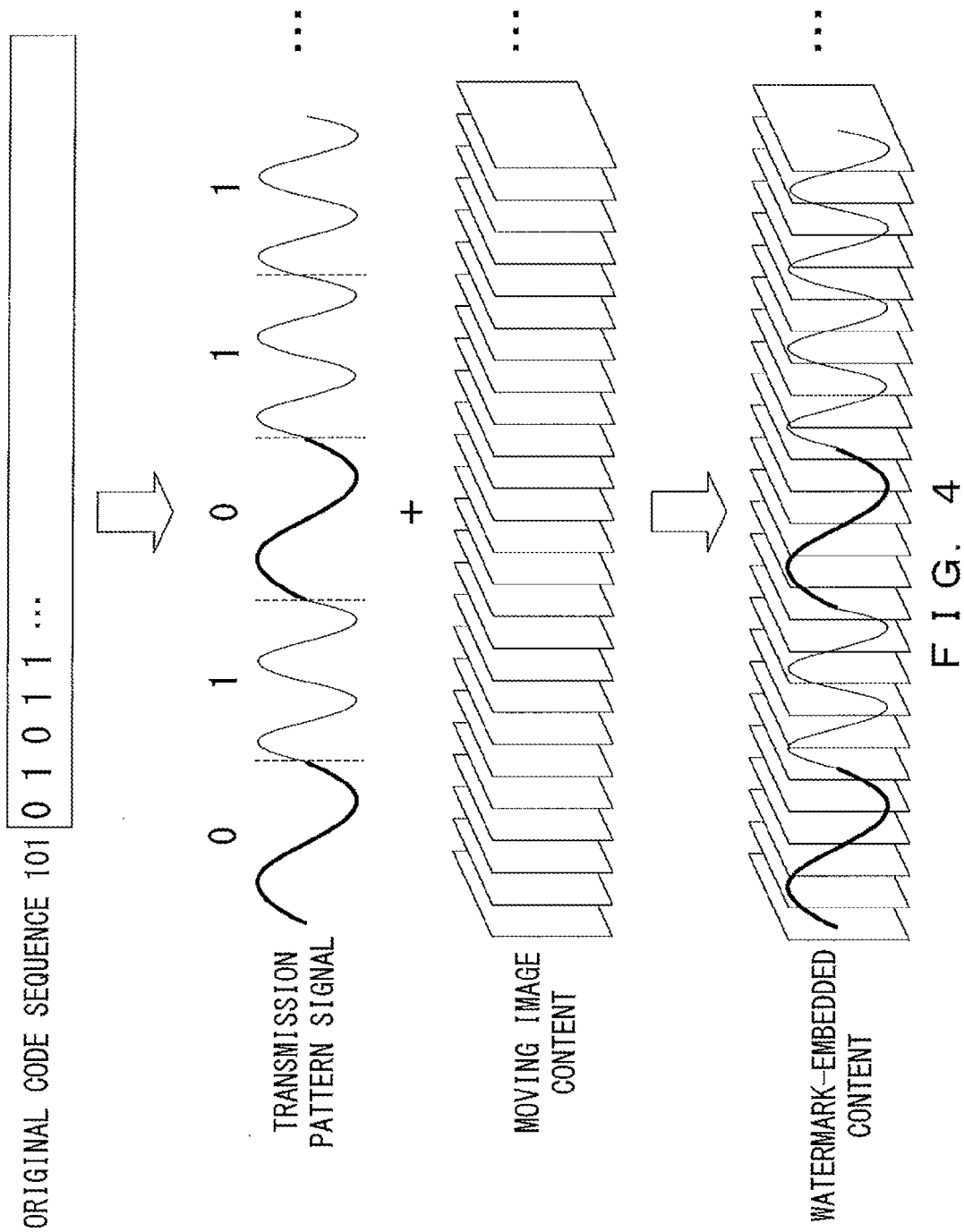
F I G. 4

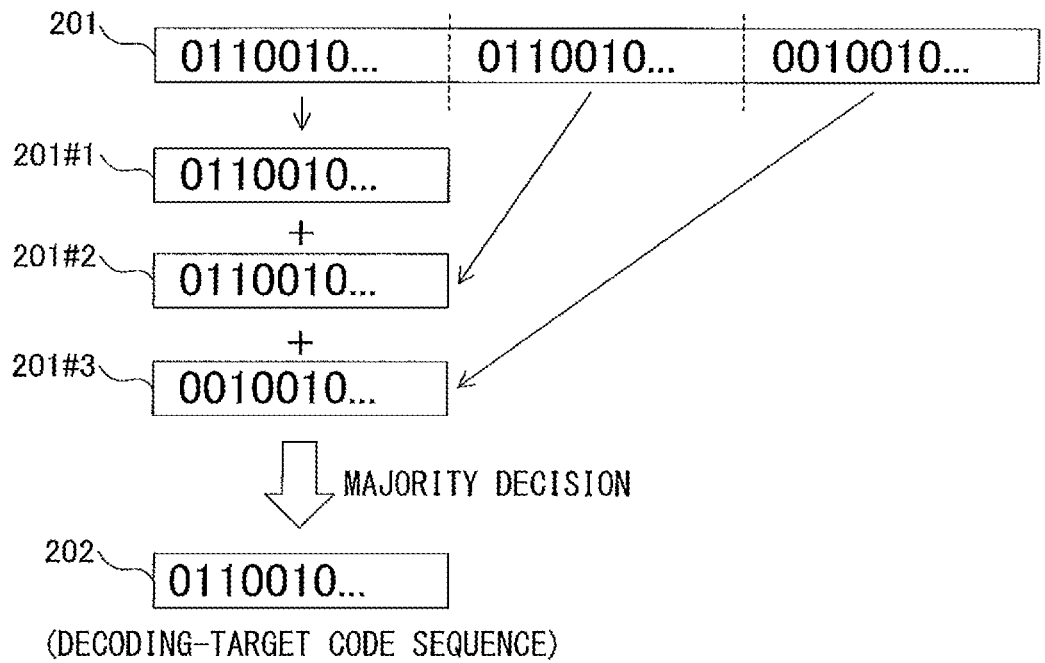
F I G. 8 A
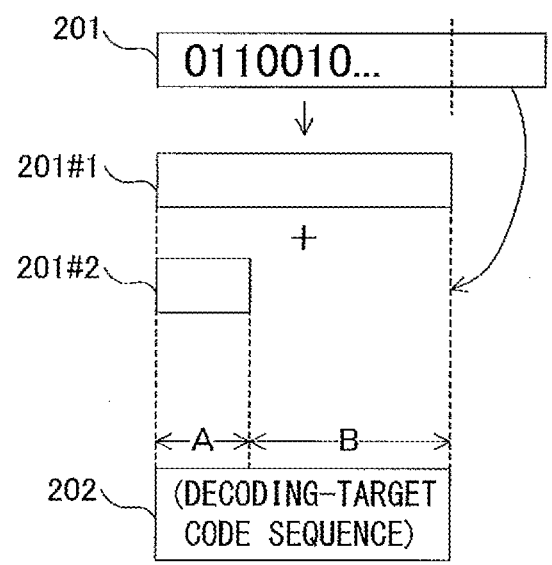
F I G. 8 B

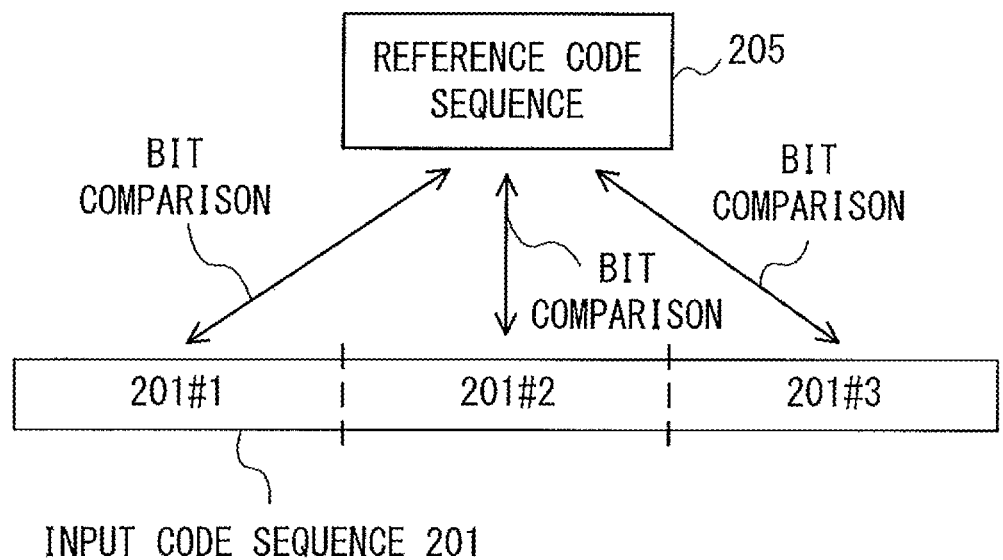
F I G. 9

| L/N (REPETITION NUMBER) | q (BIT MATCH RATIO EXPECTED VALUE) |
|---:|---:|
| 1 | 1 |
| 2 | 0.75 |
| 3 | 0.708 |
| 4 | 0.677 |
| 5 | 0.658 |
| 6 | 0.644 |
| 7 | 0.633 |
| 8 | 0.623 |
| 9 | 0.617 |
| 10 | 0.61 |
| 20 | 0.578 |
| 50 | 0.549 |
| 100 | 0.535 |
| 1000 | 0.511 |

FIG. 10

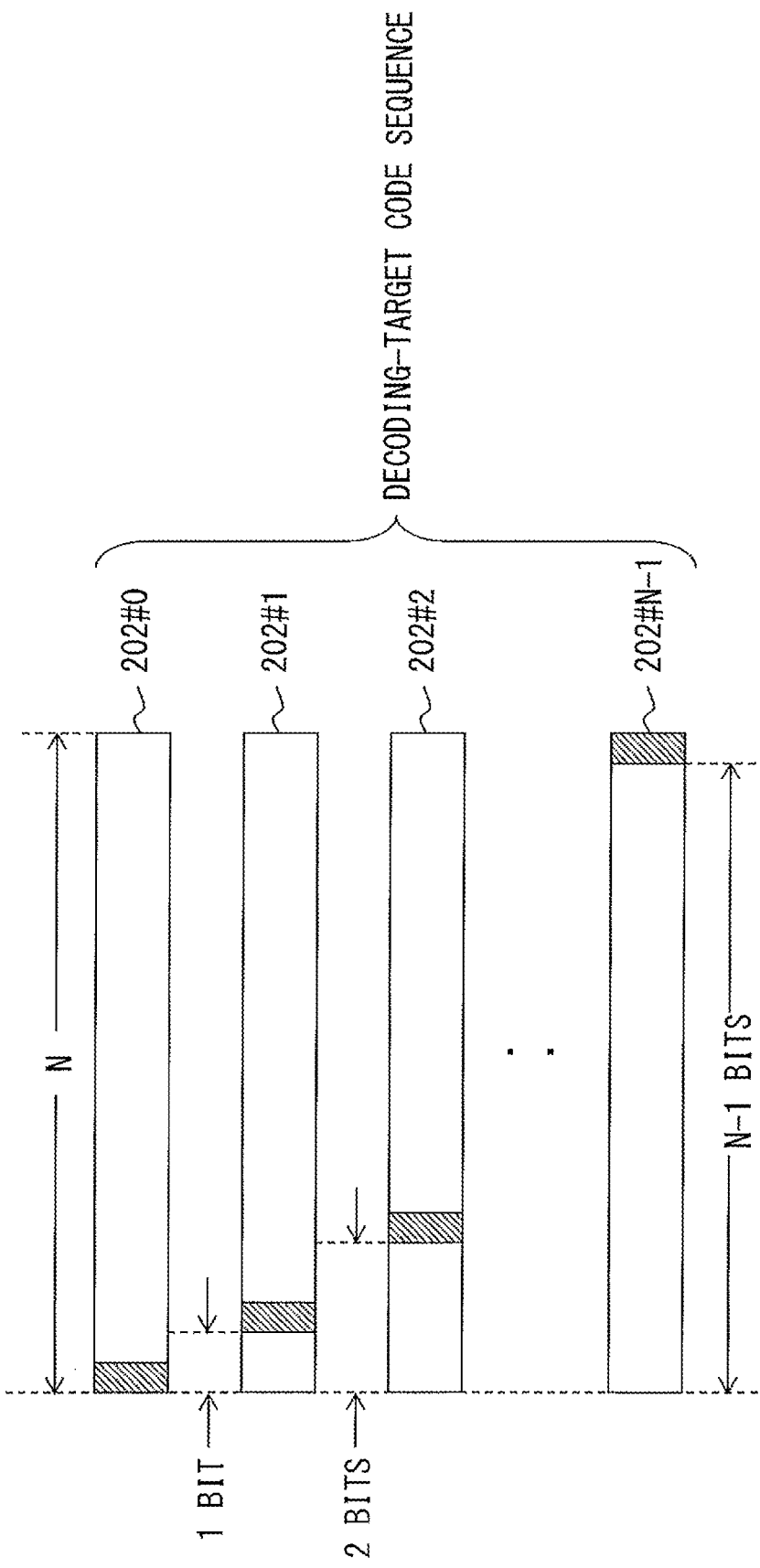

ERROR DETECTION DEVICE AND ERROR DETECTING METHOD

CROSS-REFERENCE TO RELATED APPLICATION

This application is based upon and claims the benefit of priority of the prior Japanese Patent Application No. 2014-044414, filed on Mar. 6, 2014, the entire contents of which are incorporated herein by reference.

FIELD

The embodiments discussed herein are related to a device and a method for detecting an error in an input signal.

BACKGROUND

Services for transmitting digital data are widespread. Data may be transmitted by using various media in accordance with the intended use thereof. For example, digital data is transmitted by using electromagnetic waves on the Internet and terrestrial digital broadcasting. In addition, a technique for transmitting digital data by using an image (a QR code, an image watermark, etc.) and a technique for transmitting digital data by using acoustic waves (an audio watermark, etc.) have been put into practical use.

A data error may occur in data transmission. Thus, a method for detecting and correcting a data error has been put into practical use. An error detection code and an error correction code is widely known as a method for detecting and correcting a data error.

FIG. 1 is a diagram explaining data transmission that uses an error detection code and an error correction code. In the data transmission that uses an error detection code/error correction code, a transmitter generates a code sequence by adding to original data the error detection code and the error correction code. The error detection code and the error correction code are generated according to the original data. Then, the transmitter sends the code sequence by using, for example, a carrier wave. On the other hand, a receiver decodes a received signal and extracts the code sequence. Then, the receiver executes an error correction on the received code sequence by using the error correction code. Thus, an error that is generated during transmission is corrected. However, the error correction code may not be able to correct all the errors. Therefore, the receiver verifies whether or not data is correctly recovered by using the error detection code. As a result, when no errors are detected in the recovered data, the recovered data is output.

As described, in the data transmission that uses the error detection code/error correction code, an error that is generated during transmission is corrected by using the error correction code. An error that remains after a correction process is detected by using the error detection code. Therefore, output of data that includes an error is prevented in the receiver.

Techniques related to error correction are disclosed, for example, in Japanese Laid-open Patent Publication No. 4-3525 (U.S. Pat. No. 2,664,267) and Japanese Laid-open Patent Publication No. 5-6631.

In the data transmission that uses the error detection code/error correction code, noise tolerance (error detection and error correction capabilities) depends on the data length of the error detection code/error correction code. That is, when the data length of the error detection code/error correction code is increased, the error detection and error correction capabilities are enhanced. However, when the data length of the error detection code/error correction code is long, a long time is taken to verify the recovered data in the receiver. In this case, user convenience may be degraded.

For example, a service is known wherein watermark data is added to an image (including a moving image) and a user is guided to a site that is related to the image. When a user receives this service, the user captures the image by using an electronic camera. Then, the watermark data is reproduced from input data. At that time, when an error detection code/error correction code that is added to the watermark data is long, a long time is taken to execute an error detection process/error correction process, and thus a long time is taken to reproduce the watermark data. In this case, the user may be bothered when the user receives the service.

On the other hand, when the data length of the error detection code/error correction code is shortened in order to reduce a time that is taken for the error detection process/error correction process, it may be decided that data is correctly recovered even though the data is not correctly recovered. That is, even though the recovered data contains an error, the error may not be detected by the error detection code. Hereinafter, such a case will be referred to as a "detection error" (or a decision error).

The detection error is generated, for example, when recovered data and an error detection code respectively include an error, and an error detection code that corresponds to the recovered data matches the received error detection code. That is, the detection error is generated by a "coincidence". Therefore, when the error detection code is short, a probability that the detection error will be generated may be higher. For example, the probability that the detection error is generated when the data length of the error detection code is n bits is $1/2^n$.

SUMMARY

According to an aspect of the embodiments, an error detection device includes: a code sequence generator configured to generate an input code sequence from a signal that repeatedly transmits a code sequence that includes data, an error detection code, and an error correction code; a decoding-target code sequence generator configured to generate a decoding-target code sequence that includes recovered data, an error detection code, and an error correction code from the input code sequence; an error corrector configured to generate a corrected code sequence by executing an error correction process that uses the error correction code in the decoding-target code sequence on the decoding-target code sequence; an error detector configured to decide whether or not the recovered data in the corrected code sequence includes an error by using the error detection code in the decoding-target code sequence; a reference code sequence generator configured to generate a reference code sequence that is obtained by adding to the corrected code sequence a corresponding error correction code, or a reference code sequence that is obtained by adding to the recovered data a corresponding error detection code and a corresponding error correction code, when the error detector decides that the recovered data includes no errors; and a verification unit configured to verify whether or not a decision that is made by the error detector is correct according to a comparison result between the reference code sequence and a sequence of a corresponding area in the input code sequence.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 1 is a diagram explaining data transmission that uses an error detection code/error correction code.

FIG. 2 illustrates an example of a code sequence generator.

FIG. 4 is a diagram explaining a method for embedding a code sequence in a moving image.

FIGS. 8A and 8B are diagrams explaining a method for generating a decoding-target code sequence.

FIG. 9 is a diagram explaining a method for comparing a reference code sequence and an input code sequence.

FIG. 10 illustrates simulation results for bit match ratio expected values.

FIG. 16 is a diagram explaining a method for generating a decoding-target code sequence in a third embodiment.

DESCRIPTION OF EMBODIMENTS

Figure 3A:
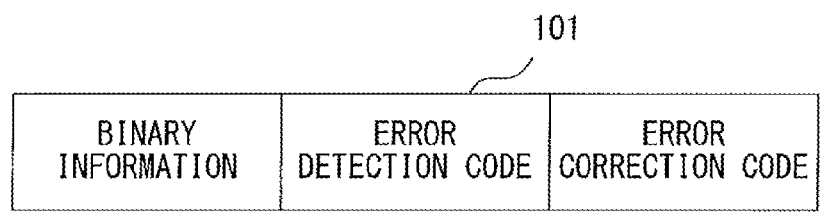
FIGS. 3A and 3B illustrate configuration examples of a code sequence.

An error detector according to the embodiments of the invention is, for example, implemented in a decoder for reproducing data from a code sequence that includes data, an error detection code, and an error correction code. Alternatively, the error detector may be operated in conjunction with the decoder for reproducing the data from the code sequence. The data is binarized digital data, and hereinafter may be referred to as "binary information".

FIG. 2 illustrates an example of a code sequence generator that generates a code sequence including binary information, an error detection code, and an error correction code. As illustrated in FIG. 2, the code sequence generator 10 includes an error detection code generator 11, an error correction code generator 12, a transmission pattern signal generator 13, and an output unit 14.

The error detection code generator 11 generates an error detection code according to input binary information. The error detection code is realized, for example, by a CRC (Cyclic Redundancy Check). The error detection code generator 11 adds the error detection code at the end of the binary information. The error detection code is used for detecting an error in the binary information. It is assumed that the data length of the error detection code is specified in advance.

The error correction code generator 12 generates an error correction code according to the binary information and the error detection code. The error correction code is realized, for example, by a BCH code. The error correction code generator 12 adds the error correction code subsequent to the error detection code. The error correction code is used for correcting an error in the binary information and in the error detection code. It is assumed that the data length of the error correction code is specified in advance.

Figure 3B:
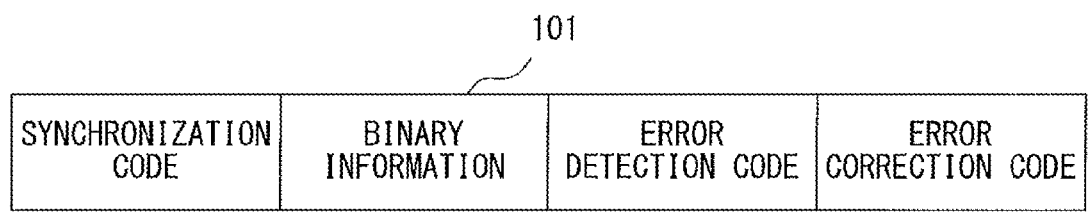

FIGS. 3A and 3B illustrate examples of a code sequence that is generated by the code sequence generator 10. As illustrated in FIG. 3A, the code sequence 101 includes binary information, an error detection code, and an error correction code. Specifically, the error detection code is added subsequent to the binary information, and the error correction code is added subsequent to the error detection code. Hereinafter, a code sequence that is generated by the code sequence generator 10 may be referred to as an "original code sequence".

As illustrated in FIG. 3B, the original code sequence 101 may further include a synchronization code in addition to the binary information, the error detection code, and the error correction code. The synchronization code has a bit pattern that is specified in advance. For example, the synchronization code is 8-bit data "11110000". When the original code sequence 101 includes the synchronization code, the code sequence generator 10 includes a synchronization code generator 15 illustrated in FIG. 2. In this case, as illustrated in FIG. 3B, the synchronization code generator 15 adds the synchronization code at the head of the binary information.

The transmission pattern generator 13 converts the original code sequence 101 that is illustrated in FIG. 3A or FIG. 3B into transmission pattern signal. When a medium that transmits the code sequence is a carrier wave (electromagnetic wave, acoustic wave, etc.), the transmission pattern signal generator 13 may generate a transmission pattern signal by modulating the carrier wave with the original code sequence 101. In this case, the phase, the frequency or the amplitude of the carrier wave is modulated according to, for example, the logical value of each bit of the original code sequence 101.

The original code sequence 101 may be embedded in an image (including a moving image) or sound as a "watermark". In the example illustrated in FIG. 4, the original code sequence 101 is converted into a transmission pattern signal, and is superimposed on moving image data in accordance with a specified rule. In this case, the original code sequence 101 is embedded in the moving image so as not to be recognized by human eyes.

Figure 5:
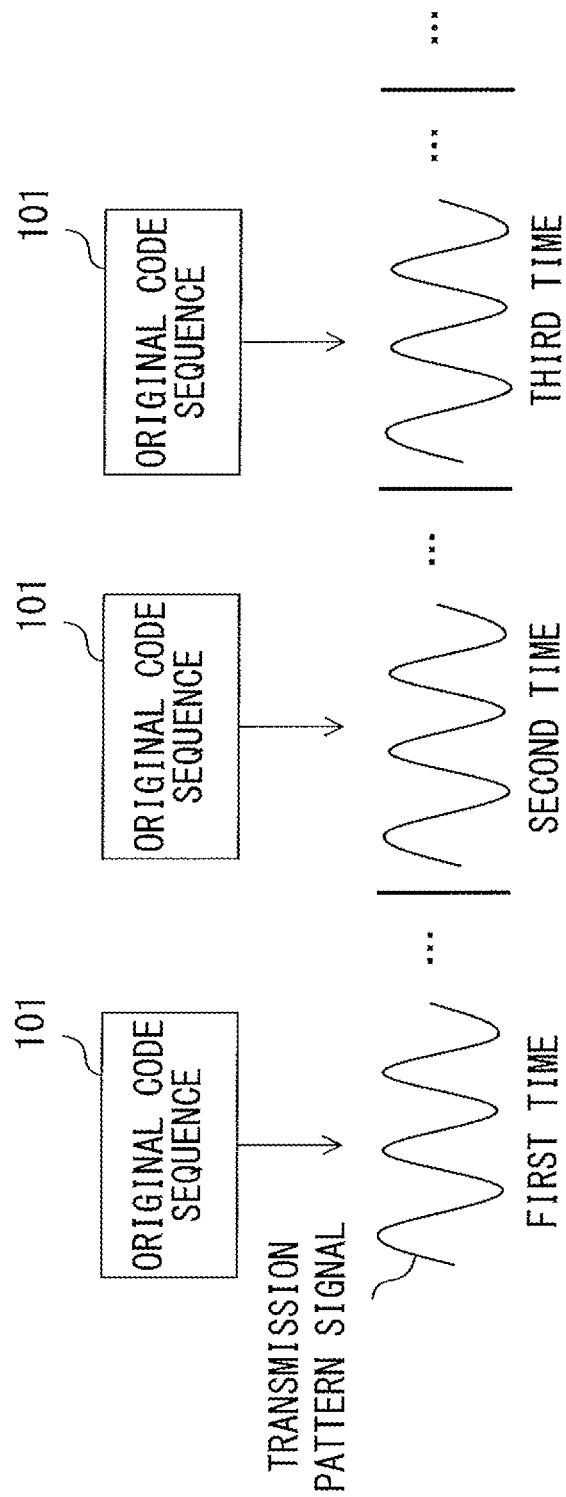
FIG. 5 is a diagram explaining an operation for repeatedly sending a code sequence.

As illustrated in FIG. 5, the output unit 14 outputs a transmission pattern signal that is generated by the transmission pattern signal generator 13. At that time, the output unit 14 repeatedly outputs the same transmission pattern signal at least twice. That is, the code sequence generator 10 repeatedly outputs the original code sequence 101. It is assumed that the original code sequence 101 is continuously and repeatedly output.

As described, the code sequence generator 10 generates the original code sequence 101 that includes data. Then, the original code sequence 101 is converted into the transmission pattern signal and output. At that time, the code sequence generator 10 repeatedly outputs the original code sequence 101.

The original code sequence 101 that is output from the code sequence generator 10 is acquired by the decoder. At that time, the decoder recovers the data (that is, binary information) by decoding the acquired code sequence. The decoder has an error detection function for detecting whether or not the binary information has been correctly recovered.

First Embodiment

Figure 6:
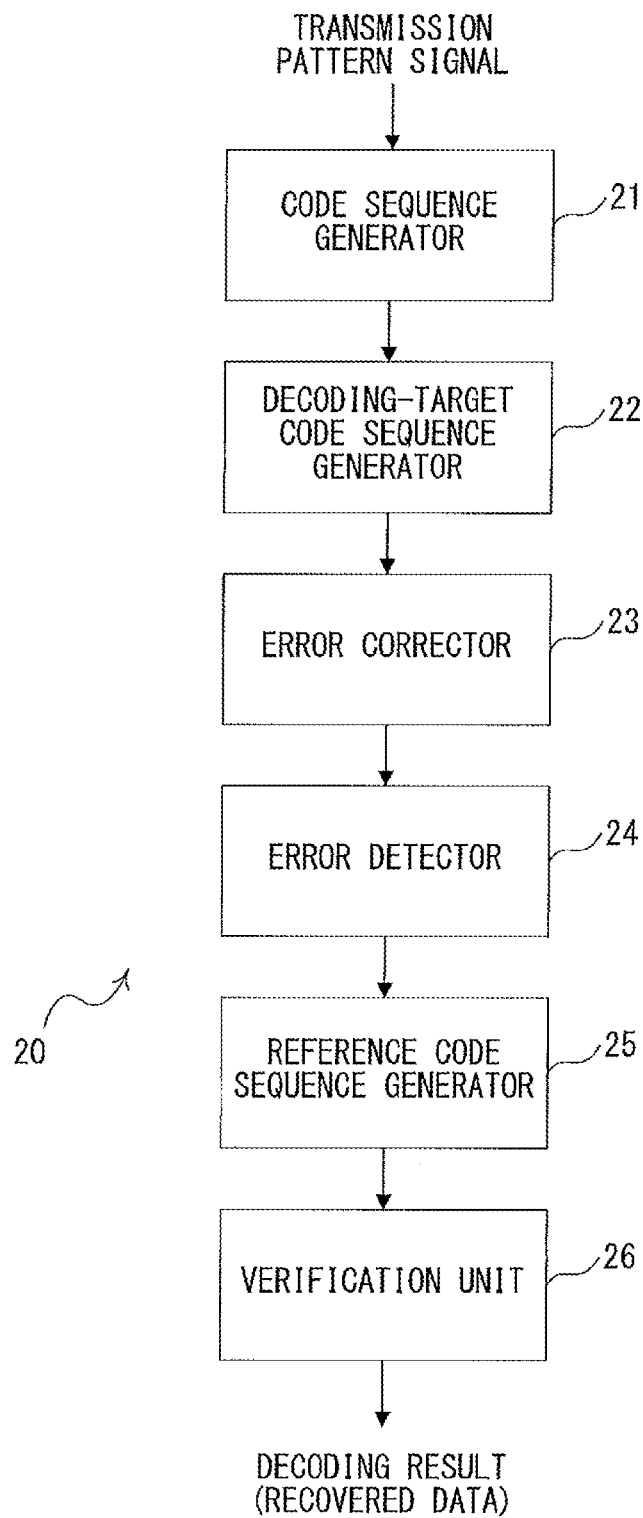
FIG. 6 illustrates an example of a decoder.

FIG. 6 illustrates an example of the decoder. As illustrated in FIG. 6, the decoder 20 includes a code sequence generator 21, a decoding-target code sequence generator 22, an error corrector 23, an error detector 24, a reference code sequence generator 25, and a verification unit 26. The decoder may verify whether binary information is correctly recovered when the binary information is recovered from an input code sequence. Therefore, the decoder 20 also operates as an error detection device.

The decoder 20 receives or acquires the transmission pattern signal that is explained with reference to FIGS. 2-5. The transmission pattern signal is generated, for example, by modulating a carrier wave with the original code sequence 101. In this case, the decoder 20 receives the transmission pattern signal that is transmitted from a transmitter via a wired link or a wireless link. The transmission pattern signal may be embedded, for example, in an image. In this case, the image in which the transmission pattern signal is embedded is captured by an electronic camera. Then, the decoder 20 acquires the transmission pattern signal from the image data that is output from the electronic camera.

The code sequence generator 21 converts the received or acquired transmission pattern signal into a code sequence. The method for converting the transmission pattern signal into the code sequence corresponds to a method for converting the original code sequence 101 into the transmission pattern signal in the code sequence generator 10. For example, when the transmission pattern signal is generated by modulating a carrier wave with the original code sequence 101 in the code sequence generator 10, the code sequence generator 21 generates a code sequence by demodulating the transmission pattern signal.

Hereinafter, the code sequence that is reproduced from the transmission pattern signal in the code sequence generator 21 may be referred to as an "input code sequence". Here, as explained with reference to FIG. 5, the code sequence generator 10 repeatedly outputs the original code sequence 101. As a result, the original code sequence 101 repeatedly appears in the input code sequence that is obtained by the code sequence generator 21.

However, the transmission pattern signal that is received or acquired by the decoder 20 is deteriorated, for example, by noise on a transmission path. When the transmission pattern signal is deteriorated, the code sequence (that is, the input code sequence) that is generated by the code sequence generator 21 may contain an error.

The code sequence to be reproduced may not be binarized data. For example, when the possibility that a bit is 1 is 25 percent, the bit may be referred to as "0.25".

Figure 7:
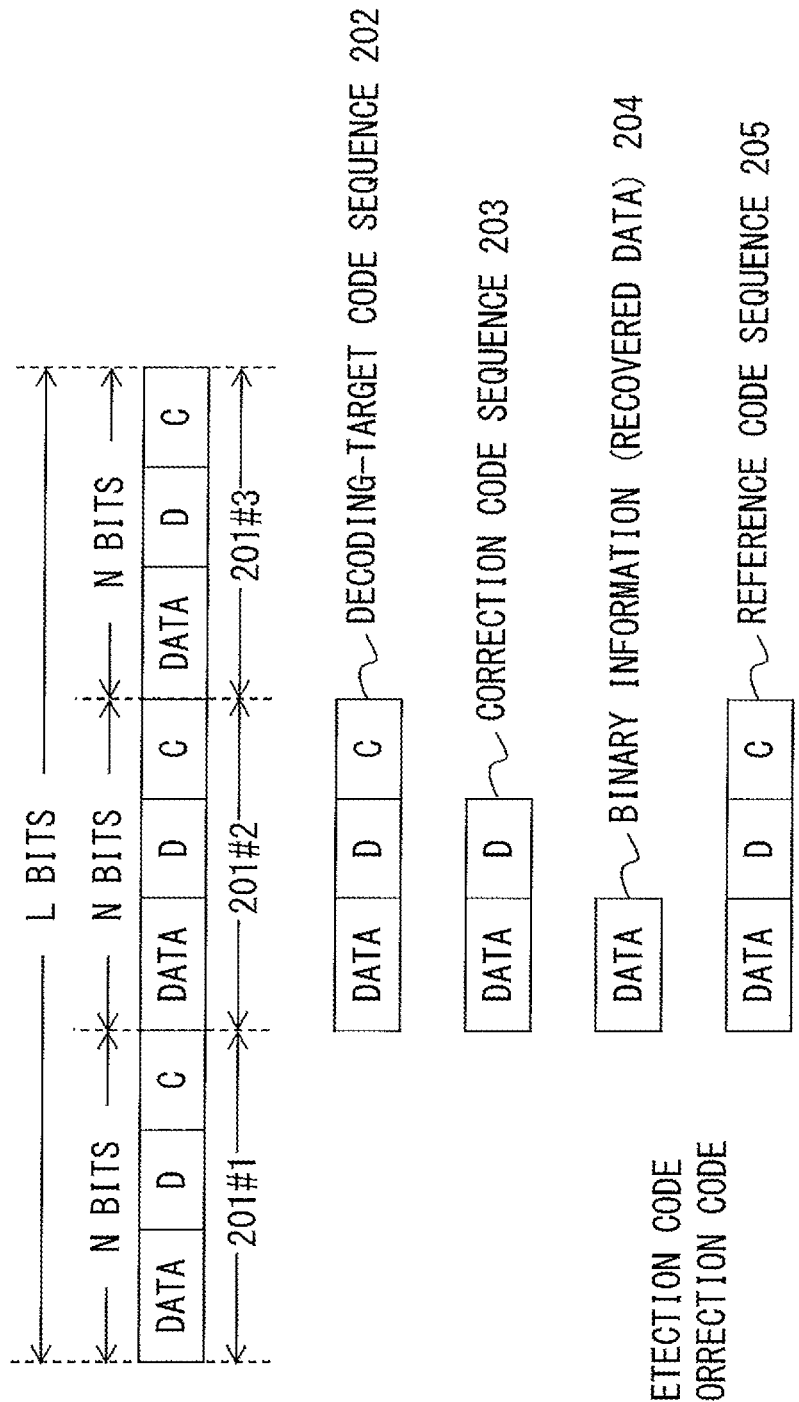
FIG. 7 is a diagram explaining an operation of the decoder.

FIG. 7 is a diagram explaining an operation of the decoder 20. In FIG. 7, "D" represents the error detection code, and "C" represents the error correction code.

In the decoder 20, the code sequence generator 21 generates the input code sequence 201 from the transmission pattern signal, and outputs the input code sequence 201. In this embodiment, the input code sequence 201 includes code sequences 201#1-201#3. Each of the code sequences 201#1-201#3 corresponds to the original code sequence 101 that is generated in the code sequence generator 10. That is, the input code sequence 201 is obtained when the original code sequence 101 is repeatedly output three times in the code sequence generator 10. Note that each of the code sequences 201#1-201#3 may include an error with respect to the original code sequence 101.

The data length of each of the code sequences 201#1-201#3 is the same as that of the original code sequence 101. Hereinafter, the data lengths of the original code sequence 101 and the code sequences 201#1-201#3 are N bits, and the data length of the input code sequence 201 is L bits. In the example illustrated in FIG. 7, L/N=3. "L/N" indicates the number of times the code sequence that corresponds to the original code sequence 101 (here, the code sequences 201#1-201#3) repeatedly appears. Hereinafter, the value of L/N may be referred to as the "repetition number".

The decoding-target code sequence generator 22 divides the input code sequence 201 for each specified length, and extracts each divided sequence. In the example illustrated in FIG. 7, the sequences 201#1-201#3 are extracted from the input code sequence 201. The "specified length" corresponds to the data length of the original code sequence 101. Here, it is assumed that the decoder 20 knows the data length of the binary information in the original code sequence 101. In addition, the data length of the error detection code and the data length of the error correction code are specified in advance. Therefore, the decoding-target code sequence generator 22 knows the data length of the original code sequence 101.

As illustrated in FIG. 8A, the decoding-target code sequence generator 22 generates a decoding-target code sequence 202 by making a majority decision for each bit on the code sequences 201#1-201#3. For example, when first bits of the code sequences 201#1-201#3 are "0", "0", and "0", respectively, the first bit of the decoding-target code sequence 202 is "0". When second bits of the code sequences 201#1-201#3 are "1", "1", and "0", respectively, the second bit of the decoding-target code sequence 202 is "1". As a result, a decoding-target code sequence 202 with the same data length as that of the original code sequence 101 may be obtained.

The error corrector 23 executes an error correction process on the decoding-target code sequence 202. At that time, the error correction process is executed by using the error correction code that is arranged at the end of the decoding-target code sequence 202. The code sequence after error correction (hereinafter referred to as a correction code sequence 203) includes the binary information and the error detection code.

The error detector 24 executes an error detection process on the correction code sequence 203. At that time, the error detection process is executed by using the error detection code that is arranged at the end of the correction code sequence 203. In the error detection process, the error detector 24 decides whether or not the binary information (that is, the recovered data) 204 in the correction code sequence 203 includes an error.

When it is decided that the binary information 204 does not include an error, the reference code sequence generator 25 generates a reference code sequence 205 by adding the corresponding error correction code to the correction code sequence 203, or by adding the corresponding error detection code and the corresponding error correction code to the binary information 204. The code sequence that is obtained by adding the corresponding error detection code to the binary information 204 is substantially the same as the correction code sequence 203.

The method for generating the error detection code/error correction code in the reference code sequence generator 25 is substantially the same as the method for generating the error detection code/error correction code in the code sequence generator 10. Therefore, when the correction code sequence 203 is correctly decoded, the reference code sequence 205 matches the original code sequence 101 that is generated in the code sequence generator 10.

The verification unit 26 verifies whether or not the binary information (that is, the recovered data) is correctly recovered according to the comparison result between the reference code sequence 205 and the sequence of the corresponding area of the input code sequence 201. Here, the verification unit 26 further verifies whether or not the binary information is correctly recovered in a method that is different from the method performed by the error detector 24, after the error detector 24 decides that there are no errors. Therefore, the verification unit 26 can verify whether or not the decision that is made by the error detector 24 is correct.

As illustrated in FIG. 9, the verification unit 26 compares respective bits between the reference code sequence 205 and the sequence of the corresponding area of the input code sequence 201. In this example, the number of matched bits (or bit match ratio) between the reference code sequence 205 and each of the sequences 201#1-201#3 are calculated.

Here, it is assumed that the bit length of the input code sequence 201 is L, the bit length of the reference code sequence 205 is N, the ith code of the input code sequence 201 is d[i], and the ith code of the reference code sequence 205 is b[i]. d[i] is equal to or greater than zero and equal to or less than 1. b[i] is zero or 1. In this case, the bit match ratio p between the reference code sequence 205 and the input code sequence 201 is expressed as Formula 1. a % b represents a reminder that is left when a is divided by b.

$$p = 1 - \frac{1}{L}\sum_{i=0}^{L-1} |d[i] - b[i \% N]| \qquad (1)$$

In Formula 1, when all d[i]s and b[i % N]s match each other, the second term on the right side is zero. On the other hand, when all d[i]s and b[i % N]s are different from each other, the second term at the right side is 1. Therefore, the bit match ratio p is calculated as a complementary event of the second term at the right side of Formula 1.

Next, a method for verifying whether the recovered binary information (that is, the recovered data) is correct according to the bit match ratio p will be described. In the following description, it is assumed that the expected value of the bit match ratio p that is obtained by Formula 1 is q when the bit string of the input code sequence 201 is random. The expected value q depends on the ratio between the bit length L of the input code sequence 201 and the bit length N of the reference code sequence 205. The ratio corresponds to the repetition number of the code sequences 201#1, 201#2, . . . , and L/N=3 in the example illustrated in FIG. 7.

FIG. 10 indicates simulation results with respect to the expected value q of the bit match ratio. According to this simulation, as L/N becomes greater (that is, as the repetition number of the original code sequence 101 becomes greater), the expected value q gradually becomes closer to 0.5.

Under this condition, each bit of the input code sequence 201 matches the corresponding bit of the reference code sequence 205 with the probability q. Therefore, the probability Pb(L,k) that the k bits of the L-bit input code sequence 201 match the corresponding bits of the reference code sequence 205 is expressed as the binomial distribution of Formula 2.

$$Pb(L,k) = {}_LC_k q^k (1-q)^{L-k} \qquad (2)$$

This binomial distribution may be approximated with the normal distribution N(Lq,Lq(1−q)) with the average Lq and the variance Lq(1−q). In other words, the distribution where the bit match ratio between the reference code sequence 205 and the L-bit input code sequence 201 is p (=k/L) may be approximated with the normal distribution N (q, q (1−q)/L) with the average q and the variance q(1−q)/L. Therefore, the probability Pn(L,q,p) that the bit match ratio between the reference code sequence 205 and the L-bit input code sequence 201 is p is expressed as Formula 3.

$$Pn(L, q, p) = \sqrt{\frac{L}{2\pi q(1-q)}} \exp\left(-\frac{L(p-q)^2}{2q(1-q)}\right) \qquad (3)$$

Figure 11:
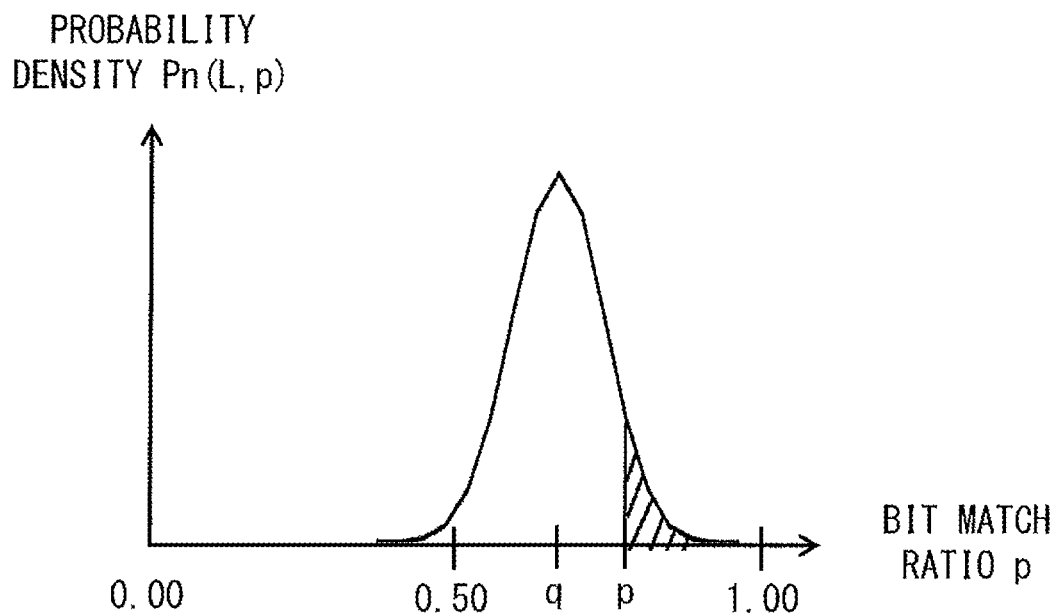
FIG. 11 illustrates probability density for a bit match ratio.

FIG. 11 illustrates the probability distribution expressed as Formula 3. That is, FIG. 11 illustrates the probability density with respect to the bit match ratio. This distribution represents the occurrence probability of the bit match ratio between the reference code sequence 205 and the input code sequence 201 when the bit string of the input code sequence 201 is random. Therefore, when the same code sequence repeatedly appears in the input code sequence 201, the bit match ratio p between the reference code sequence 205 and the input code sequence 201 is expected to be greater than the expected value q thereof.

Therefore, when the cumulative probability that is illustrated as the shaded area in FIG. 11 is smaller than a specified threshold value, the verification unit 26 decides that the error detection result that is made by the error detector 24 is correct. That is, when Formula 4 is satisfied, the verification unit 26 decides that the error detection result that is obtained by the error detector 24 is correct. Note that the left side of Formula 4 corresponds to an area of the shaded area illustrated in FIG. 11. th represents the specified threshold value.

$$\int_p^\infty Pn(L,q,x)dx \leq th \qquad (4)$$

For example, it is assumed that N=24, L=48, and the threshold value th=1/16. Then, the minimum value of the bit match ratio p that satisfies Formula 4 is 0.875. Here, 48×0.875=42. Therefore, in this case, it is decided that the probability that the error detection result is not correct is smaller than or equal to 1/16 when 42 bits or greater of the 48-bit input code sequence 201 match the reference code sequence 205. Note that if the threshold value th is made smaller, the probability that the error detection is not correct may be further lowered.

When the repetition number (the number of times the same code sequence repeatedly appears) of the input code sequence 201 is 1, the average=1 and the variance=0 in Formula 3, and thus it is difficult to perform verification by using Formula 4. As a result, in this example, it is preferable that the repetition number of the input code sequence 201 be 2 or greater.

As described, the verification unit 26 compares the reference code sequence 205 and the corresponding area of the input code sequence 201, and calculates the bit match ratio thereof. When the calculated bit match ratio is higher than a specified bit match ratio threshold, the verification unit 26 decides that the probability that the decision made by the error detector 24 is correct is higher than the threshold probability that corresponds to the bit match ratio threshold. The relationship between the bit match ratio threshold and the threshold probability depends on the ratio between the length of the input code sequence 201 and the length of the reference code sequence 205 (3 in the example illustrated in FIG. 9).

In the decoder 20 of this embodiment, as described above, the decoding-target code sequence generator 22 generates a decoding-target code sequence 202 by using the entirety of the input code sequence 201. In addition, the verification unit 26 verifies whether or not the decision made by the error detector 24 is correct according to the comparison result between the reference code sequence 205 and the entirety of the input code sequence 201.

Figure 12:
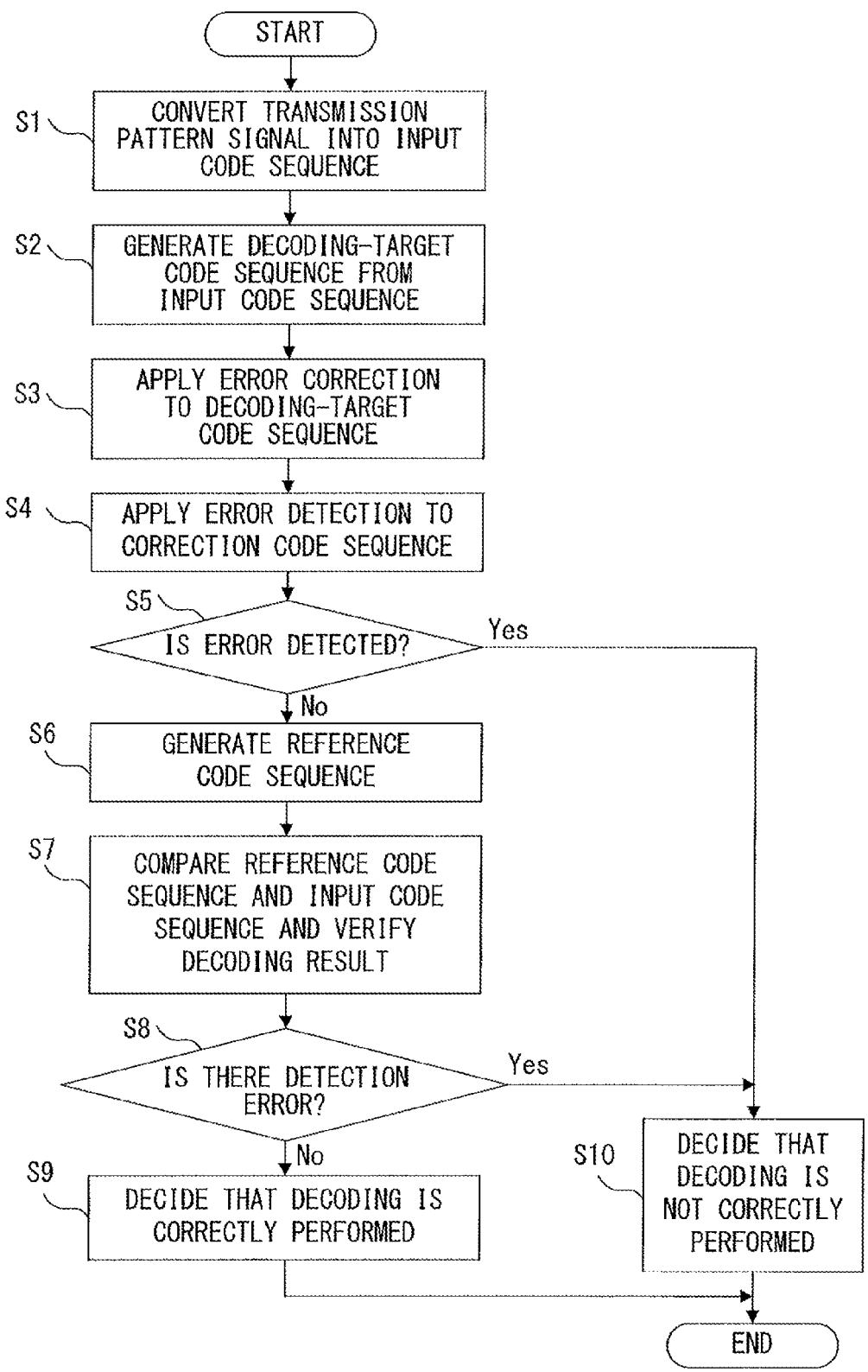
FIG. 12 is a flowchart illustrating operations of the decoder.

FIG. 12 is a flowchart illustrating operations of the decoder 20. The decoder 20 receives a transmission pattern signal that is sent from the code sequence generator 10 illustrated in FIG. 2. The transmission pattern signal repeatedly transmits a code sequence that includes data (binary information), an error detection code, and an error correction code. That is, the decoder 20 receives a transmission pattern signal that repeatedly transmits the code sequence that includes the data, the error detection code, and the error correction code.

In S1, the code sequence generator 21 converts the received transmission pattern signal into a code sequence that is composed of 0 and 1 (or values between 0 and 1). That is, the code sequence generator 21 generates the input code sequence 201 from the received transmission pattern signal. In the input code sequence 201, as illustrated in FIG. 7 for example, the same code sequences (201#1-201#3) repeatedly appear.

In S2, the decoding-target code sequence generator 22 generates the decoding-target code sequence 202 from the input code sequence 201. For example, as described with reference to FIG. 8A, a majority decision is made for each bit on the plurality of code sequences 201#1-201#3 that are extracted from the input code sequence 201, so that the decoding-target code sequence 202 is generated.

In S3, the error corrector 23 executes error correction on the decoding-target code sequence 202. Hereinafter, the code sequence after error correction is referred to as the corrected code sequence 203. The corrected code sequence 203 includes binary information and the error detection code. Note that the error correction process may not necessarily correct all the errors. That is, the corrected code sequence 203 may include an error.

In S4-S5, the error detector 24 executes the error detection process on the corrected code sequence 203, and decides whether or not the recovered binary information (that is, the recovered data) 204 includes an error. When it is decided that the recovered data 204 includes an error, the decoder 20 outputs a signal or a message that indicates that the recovered data 204 includes an error, in S10. On the other hand, when it is decided that the recovered data 204 includes no errors, the process of the decoder 20 proceeds to S6.

In S6, the reference code sequence generator 25 generates the reference code sequence 205. At that time, the reference code sequence generator 25 may generate the reference code sequence 205 by adding to the recovered data 204 the corresponding error detection code and the corresponding error correction code. Alternatively, the reference code sequence generator 25 may generate the reference code sequence 205 by adding to the correction code sequence 203 the corresponding error correction code.

In S7-S8, the verification unit 26 verifies a decoding result according to the comparison result between the reference code sequence 205 and the sequence of the corresponding area in the input code sequence 201. At that time, the reference code sequence 205 is compared with the plurality of corresponding code sequences in the input code sequence 201. In the example illustrated in FIG. 9, the reference code sequence 205 is compared with the code sequences 201#1-201#3. Then, the verification unit 26 verifies the decoding result according to the bit match ratio between the reference code sequence 205 and the input code sequence 201.

When the bit match ratio is higher than a specified threshold, the verification unit 26 decides in S9 that the recovered data 204 does not include an error. That is, the verification unit 26 decides that the decision result that is obtained by the error detector 24 is correct. In this case, the verification unit 26 outputs a signal or a message that indicates that the recovered data 204 includes no errors. On the other hand, when the bit match ratio is equal to or smaller than the threshold, the verification unit 26 decides in S10 that the recovered data 204 includes an error. That is, the verification unit 26 decides that the decision result obtained by the error detector 24 is not correct. In this case, the verification unit 26 outputs a signal or a message that indicates that the recovered data 204 includes an error.

Figure 13:
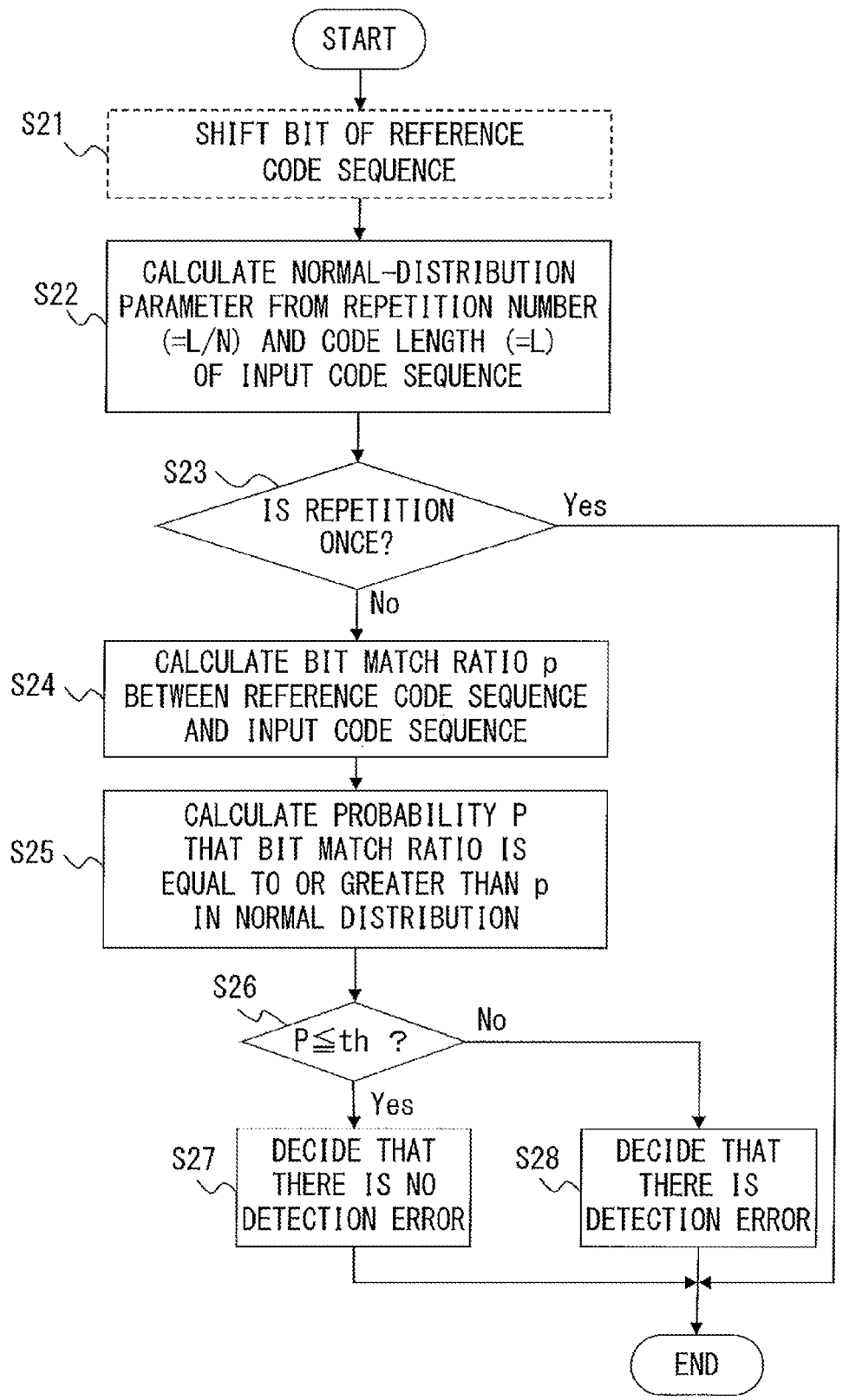
FIG. 13 is a flowchart illustrating a process of a verification unit.

FIG. 13 is a flowchart illustrating a process that is executed by the verification unit 26. The process illustrated in FIG. 13 corresponds to S7 in the flowchart illustrated in FIG. 12. Since S21 is a process that is executed in another embodiment that will be described later, the description thereof will be omitted here.

In S22, the verification unit 26 calculates the parameters (average and variance) of the normal distribution that is expressed as Formula 3 according to the code length L and the repetition number of the input code sequence 201. The repetition number corresponds to the ratio (L/N) between the length L of the input code sequence and the length N of the reference code sequence. For example, since L/N=3 in the example illustrated in FIG. 7, q=0.708 is obtained with reference to the table illustrated in FIG. 10. The q value is used as the average of the normal distribution. The variance of the normal distribution is calculated according to the q value. As described above, Formula 3 expresses the occurrence probability of the bit match ratio p between the reference code sequence 205 and the input code sequence 201 in a case in which the input code sequence is generated at random.

In S23, the verification unit 26 decides whether or not the repetition number is 1. When the repetition number is 1, the process of the verification unit 26 is terminated. On the other hand, when the repetition number is greater than 1, the process of the verification unit 26 proceeds to S24.

In S24, the verification unit 26 calculates the bit match ratio p between the reference code sequence 205 and the input code sequence 201. At that time, the verification unit 26 calculates the bit match ratio p by using, for example, the above Formula 1.

In S25, the verification unit 26 calculates the probability P that the bit match ratio is p or greater by using the normal distribution that is specified in S22. For example, the probability P is expressed as the left side of the above Formula 4. Then, in S26, the verification unit 26 compares the probability P and the threshold value th that is specified in advance. As a result, when the probability P is equal to or smaller than the threshold value th, the verification unit 26 decides that the decision made by the error detector 24 is correct in S27. On the other hand, when the probability P is greater than the threshold value th, the verification unit 26 decides that the decision made by the error detector 24 is not correct in S28.

In the above example, the verification unit 26 decides whether or not the error detection result is correct by using the normal distribution illustrated in FIG. 11. However, the invention is not limited to this method. That is, the verification unit 26 may decide whether or not an error detection result is correct according to the bit match ratio between the input code sequence 201 that includes the plurality of code sequences (201#1, 201#2, . . . ) and the reference code sequence 205. At that time, for example, when the bit match ratio is higher than a specified threshold value, it is decided that the decision made by the error detector 24 is correct.

Second Embodiment

In the second embodiment, the decoder 20 generates the input code sequence from the transmission pattern signal at an arbitrary timing. That is, the original code sequence that is generated by the code sequence generator 10 is not synchronized with the input code sequence that is generated in the decoder 20. Therefore, in many cases, as illustrated in FIG. 14, first bits of the corresponding original code sequences

1-#3 are arranged at positions other than the beginnings of the corresponding code sequences 201#1-201#3 in the input code sequence 201. In FIG. 14, the shaded areas represent the first bits of the original code sequences #1-#3.

Figure 14:
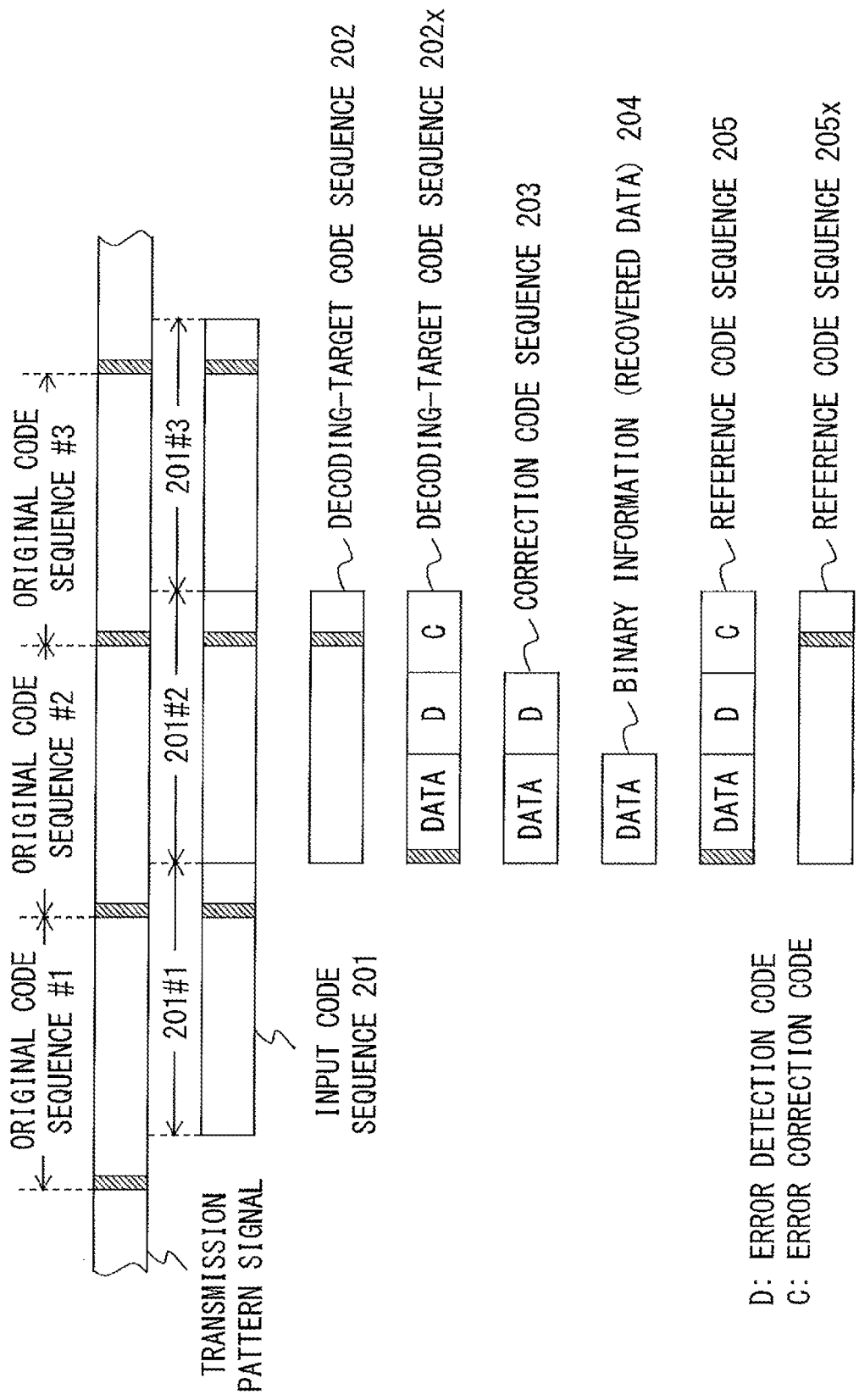
FIG. 14 is a diagram explaining an operation of a decoder according to a second embodiment.

In the example illustrated in FIG. 14, the code sequence 201#1 includes part of the original code sequence #1 and part of the original code sequence #2. Similarly, the code sequence 201#2 includes part of the original code sequence #2 and part of the original code sequence #3. Therefore, in this case, when the decoding-target code sequence 202 is generated by making the majority decision on the code sequences 201#1-201#3, the original first bit is arranged at a position other than the beginning of the decoding-target code sequence 202.

The decoding-target code sequence generator 22 compensates for this positional deviation. Hereinafter, as illustrated in FIG. 3B, a process for compensating for the positional deviation will be described, assuming that a synchronization code is given to the beginning of the original code sequence 101.

Figure 15:
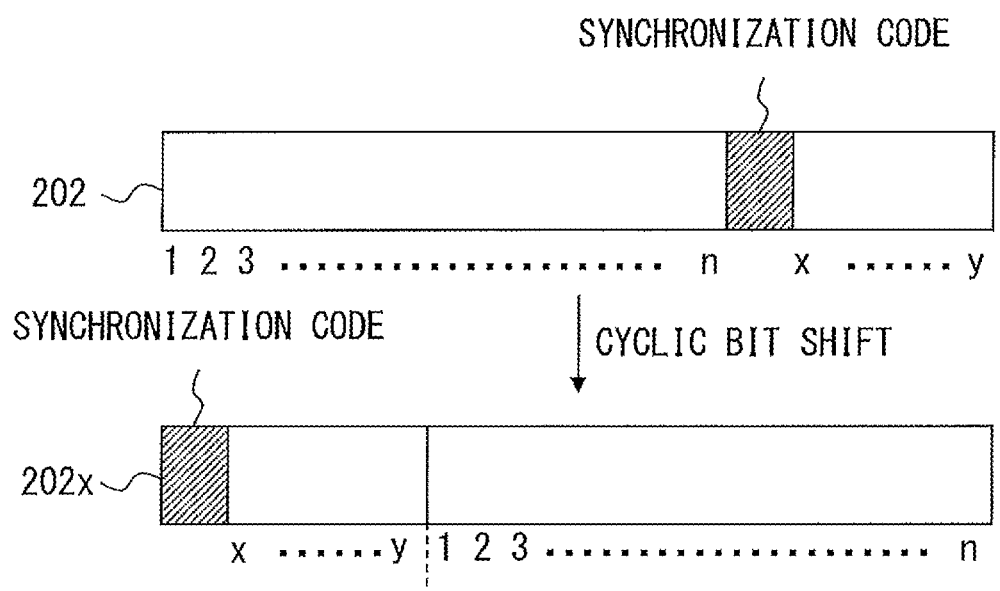
FIG. 15 is a diagram explaining a bit shift of a decoding-target code sequence.

The decoding-target code sequence generator 22 detects the synchronization code from the decoding-target code sequence 202. Then, the decoding-target code sequence generator 22 generates a decoding-target code sequence 202x by cyclically shifting each bit of the decoding-target code sequence 202 with reference to the synchronization code. In the example illustrated in FIG. 15, bits x-y of the decoding target code sequence 202 are arranged at the beginning of the decoding-target code sequence 202x, and bits 1-n of the decoding-target code 202 are arranged subsequent to them. As a result, in the decoding-target code sequence 202x, in the same order as in the original code sequence 101, the binary information, the error detection code, and the error correction code are sequentially arranged.

The operations of the error corrector 23, the error detector 24, the reference code sequence generator 25, and the verification unit 26 are substantially the same in the first and second embodiments. That is, also in the second embodiment, error correction and error detection are performed as illustrated in FIG. 14. Then, when no errors are detected in the code sequence after correction, the reference code sequence generator 25 generates the reference code sequence 205. However, in the second embodiment, the reference code sequence generator 25 returns the bit positions of the reference code sequence 205 to the original state. Specifically, a reverse process of the positional deviation compensation that is executed by the decoding-target code sequence generator 22 is executed. As a result, a reference code sequence 205x is generated. For example, when the decoding-target code sequence 202x is generated from the decoding-target code sequence 202 by k-bit cyclic shifting, the reference code sequence generator 25 generates a reference code sequence 205x from the reference code sequence 205 by k-bit cyclic shifting in opposite direction. The position of the synchronization code in the reference code sequence 205x is the same as that of the synchronization code in each of the code sequences 201#1-201#3. Thereafter, the verification unit 26 performs verification that is the same as that in the first embodiment by using the reference code sequence 205x.

The processes of the flowcharts illustrated in FIGS. 12 and 13 in the first embodiment are substantially the same as those in the second embodiment. However, in the second embodiment, in order to compensate for positional deviation, the process for generating the decoding-target code sequence 202x from the decoding-target code sequence 202 is executed in S2. In addition, in order to return the bit positions in the code sequence to the original positions, the reference code sequence 205x is generated from the reference code sequence 205 in S21.

Third Embodiment

In the second embodiment, positional deviation between the original code sequence and the input code sequence is compensated for by using the synchronization code. On the other hand, in the third embodiment, the detector 20 executes error correction and error detection without detecting the beginning of each code sequence that is included in the input code sequence.

Also in the third embodiment, as illustrated in FIG. 8A, the decoding-target code sequence generator 22 generates the decoding-target code sequence 202 with a majority decision. However, as illustrated in FIG. 16, the decoding-target code sequence generator 22 generates a decoding-target code sequence #i by performing an i-bit cyclic shift on the decoding-target code sequence 202. Here, when it is assumed that the data length of the decoding-target code sequence 202 (that is, the data length of the original code sequence) is N bits, i is 0 to N−1. That is, the decoding-target code sequence generator 22 generates decoding-target code sequences 202#0 to 202#N−1.

The operations of the error corrector 23, the error detector 24, the reference code sequence generator 25, and the verification unit 26 are substantially the same in the first and third embodiments. However, in the third embodiment, the error corrector 23, the error detector 24, the reference code sequence generator 25, and the verification unit 26 execute the same process as that in the first embodiment on each of the decoding-target code sequences 202#0 to 202#N−1. That is, the process in S3-S10 illustrated in FIG. 12 is executed on each of the decoding-target code sequences 202#0 to 202#N−1.

At that time, the error corrector 23 executes error correction and generates the corresponding correction code sequence by using bits of the specified area (area for arranging the error correction code) in the decoding-target code sequence. The error detector 24 executes error detection by using bits of the specified area (area for arranging the error detection code) in the correction code sequence. Therefore, when there is positional deviation, error correction is executed by using a bit string that is not the error correction code, and error detection is executed by using a bit string that is not the error detection code. In this case, an error is detected with a high probability. That is, when the process in S3-S10 is executed on each of the decoding-target code sequences 202#0 to 202#N−1, a decoding-target code sequence with positional deviation is excluded in S5. As a result, the verification unit 26 performs verification on a decoding-target code sequence for which a bit shift is appropriately performed. Thus, the decoder 20 can output correctly decoded data.

The verification unit 26 executes S21 illustrated in FIG. 13. At that time, the verification unit 26 performs i-bit cyclic shifting in opposite direction on the decoding-target code sequence 202#i. For example, 2-bit cyclic shifting in opposite direction is performed on the decoding-target code sequence 202#2. The verification process in S22-28 thereafter is substantially the same in the first and third embodiments.

Fourth Embodiment

In the first to third embodiments, the data length of each of the code sequences (201#1-201#3) that are extracted from the transmission pattern signal is the same as that of the original code sequence. That is, in the first to third embodiments, the repetition number of the input code sequence is an integer. On the other hand, in the fourth embodiment, the repetition number of the input code sequence is not always an integer. That is, in the fourth embodiment, the data length of at least one of the plurality of code sequences that are extracted from the transmission pattern signal may be shorter than the original code sequence. For example, in the example illustrated in FIG. 8B, the data length of the code sequence 201#1 is the same as that of the original code sequence 101, and the data length of the code sequence 201#2 is shorter than that of the original code sequence 101.

The decoding-target code sequence generator 22 generates the decoding-target code sequence by using the plurality of code sequences with different data lengths. For example, in the case illustrated in FIG. 8B, in a bit area A, the decoding-target code sequence 202 may be obtained by making a majority decision for each bit on the code sequences 201#1 and 201#2. In a bit area B, the decoding-target code sequence 202 is generated from the code sequence 201#1.

The operations of the error corrector 23, the error detector 24, and the reference code sequence generator 25 are substantially the same in the first and fourth embodiments. However, in the fourth embodiment, the repetition number of the input code sequence is not always an integer. As a result, the operation of the verification unit 26 in the first embodiment is not the same as that in the fourth embodiment.

The verification unit 26 divides the reference code sequence 205 and calculates the bit match ratio with the input code sequence with respect to each partial sequence. For example, in the example illustrated in FIG. 17A, a determination of Formula 4 is made on the bit area A according to the bit match ratio between the code sequences 201#1 and 201#2 and the reference code sequence 205. A determination of Formula 4 is made on the bit area B according to the bit match ratio between the code sequence 201#1 and the reference code sequence 205. Then, for example, when the condition of Formula 4 is satisfied both in the bit area A and the bit area B, the verification unit 26 decides that the probability that the error detection result is correct is higher than or equal to a specified threshold.

Figure 17A:
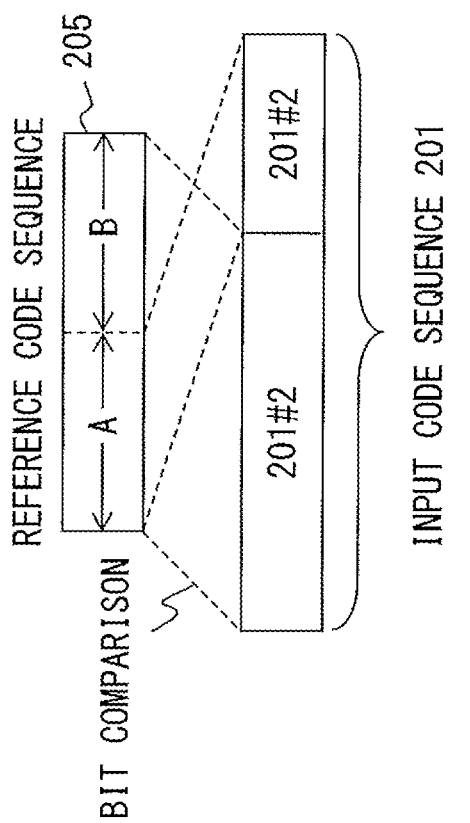
FIGS. 17A and 17B are diagrams explaining a method for calculating a bit match ratio in a fourth embodiment.

However, in the example illustrated in FIG. 17A, two code sequences (201#1 and 201#2) are used for the bit area A, but one code sequence (201#1) is used for the bit area B. That is, the expected value q of the bit match ratio between the reference code sequence and the input code sequence is 1 in the bit area B, and it is difficult to perform verification based on Formula 4. Therefore, in this case, the verification unit 26 may make a determination of Formula 4 only based on the bit area A.

In addition, when the repetition number is not an integer, the process in S24-28 is executed on each of the plurality of partial code sequences that are obtained by dividing the reference code sequence. Then, for example, when it is decided that "there are no detection errors" for all of the partial sequences, the verification unit 26 decides that a decision made by the error detector 24 is correct.

Figure 17B:
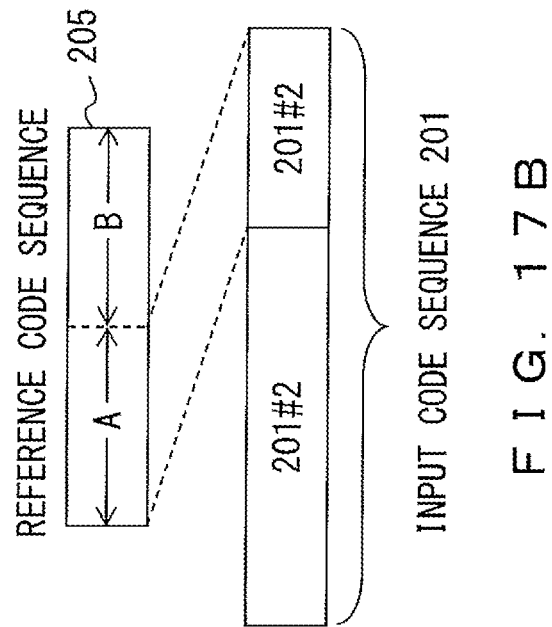

In addition, as illustrated in FIG. 17B, when the code length of the second code sequence 201#2 in the input code sequence 201 is shorter than the original code sequence 101, the decoder 20 may decode a reception code sequence in the following manner. That is, the code sequence generator 21 outputs the first code sequence 201#1 in the input code sequence 201 as it is as the decoding-target code sequence 202. The processes of the error corrector 23, the error detector 24, and the reference code sequence generator 25 are the same as in the case in which the repetition number is an integer.

Then, the verification unit 26 calculates the bit match ratio p between the reference code sequence 205 and the second code sequence 201#2 in the input code sequence 201. At that time, since the code sequence 201#2 is shorter than the reference code sequence 205, the bit match ratio between part of the reference code sequence 205 and the code sequence 201#2 is calculated. The first code sequence 201#1 in the input code sequence 201 is not used in calculation of the bit match ratio.

Here, assuming that each code of the input code sequence 201 is generated at random, since there is no correlation between the reference code sequence 205 and the code sequence 201#2, the expected value q of the bit match ratio is 0.5. Then, the probability Pn that the bit match ratio between the reference code sequence 205 and the code sequence 201#2 is p is expressed as Formula 5. M represents the bit length of the code sequence 201#2.

$$Pn(M, 0.5, p) = \sqrt{\frac{2M}{\pi}} \exp(-2M(p-1/2)^2) \quad (5)$$

The verification unit 26 may decide whether or not detection that is performed by the error detector 24 is correct by using Formula 6. That is, when Formula 6 is satisfied, it is decided that the detection that is performed by the error detector 24 is correct.

$$\int_p^\infty Pn(M,0.5,x)dx \le th \quad (6)$$

For example, in the case in which the bit length of the error detection code is 8 bits, the probability that the decision result of error detection is not correct (that is, a detection error rate) is about $1/256(=1/8^2)$. In order to reduce the detection error rate to, for example, 1/2048, the threshold value th of Formula 6 may be determined so as to satisfy "(1/256)×th=1/2048". In this case, th=1/8 is obtained.

The probability Pn≤1/8 is satisfied, for example, when the first 3 bits of the second code sequence 201#2 agree with the first 3 bits of the reference code sequence 205. This condition is expressed as M=3 and p=1. That is, in this case, according to the method of the embodiments, an error detection capability that is the same as that in the case in which the error detection code is lengthened by 3 bits may be obtained. In other words, according to the method of the embodiments, an error detection capability may be enhanced without lengthening the error detection code.

In the above first to fourth embodiments, the verification unit 26 decides whether or not the error detection result is correct by using the normal distribution illustrated in FIG. 12; however, the invention is not limited to this method. That is, the verification unit 26 may decide whether or not the error detection result is correct according to the bit match ratio between the input code sequence that includes the plurality of code sequences (201#1, 201#2, . . . ) and the reference code sequence.

Hardware Configuration of Error Detector

Figure 18:
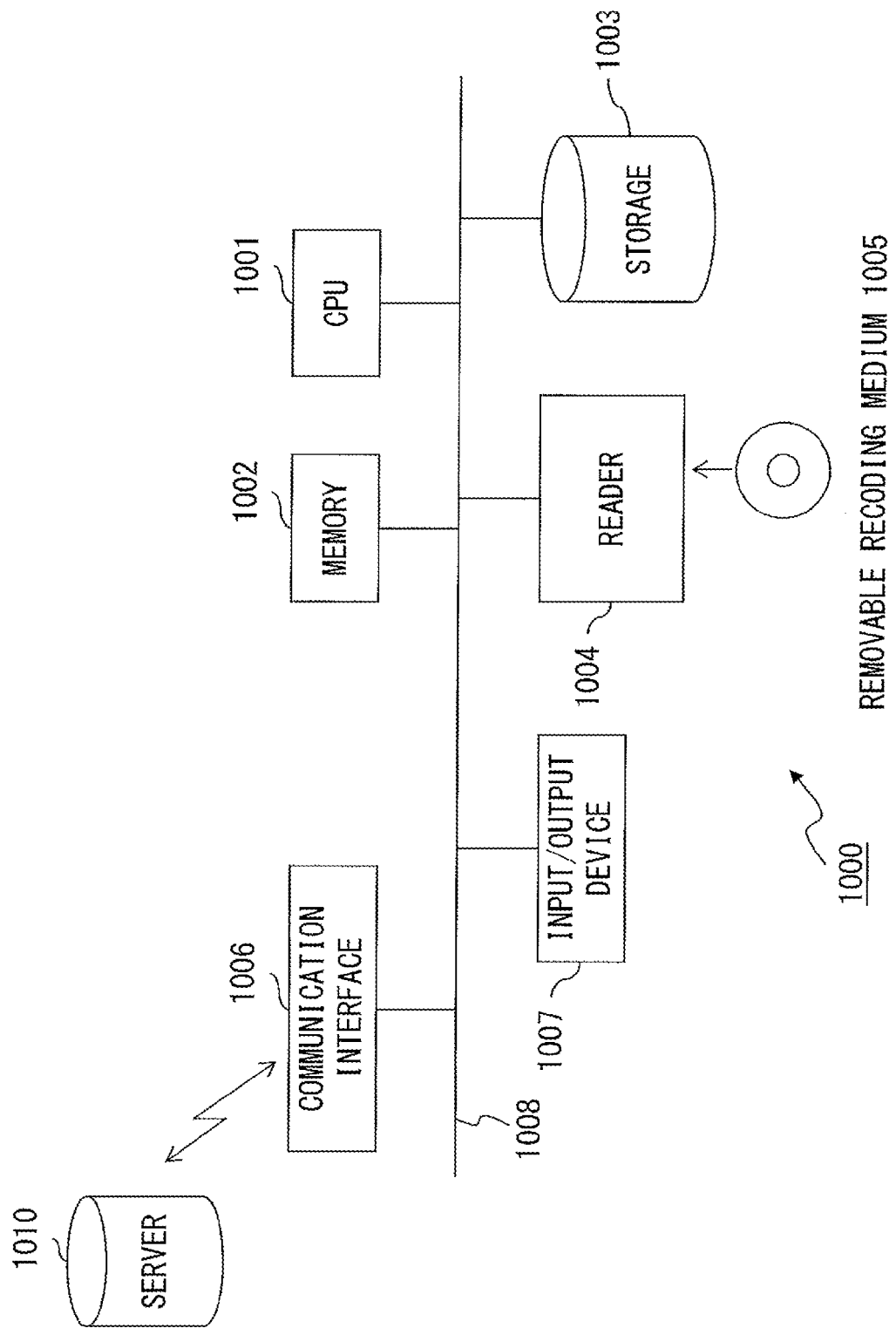
FIG. 18 illustrates an example of the hardware configuration of an error detector.

FIG. 18 illustrates an example of the hardware configuration of the error detector according to the embodiments. The error detector (decoder) includes a computer system 1000 illustrated in FIG. 18. The computer system 1000 includes a CPU 1001, a memory 1002, a storage 1003, a reader 1004, a communication interface 1006, and an input/output device 1007. The CPU 1001, the memory 1002, the storage 1003, the reader 1004, the communication interface 1006, and the input/output device 1007 are connected with one another, for example, through a bus 1008.

The CPU 1001 executes an error detection program that describes the processes of the flowcharts illustrated in FIGS. 12 and 13. Thus, the above error detection method is realized. The memory 1002 is, for example, a semiconductor memory, and is configured by including a RAM area and a ROM area. The storage 1003 is, for example, a hard disk device and stores the above error detection program. The storage 1003 may be a semiconductor memory such as a flash memory. The storage 1003 may also be an external storage.

The reader 1004 accesses a removable recording medium 1005 according to instructions from the CPU 1001. The removable recording medium 1005 is realized, for example, by a semiconductor device (USB memory etc.), a medium to/from which information in input/output by magnetic action (magnetic disk etc.), or a medium to/from which information is input/output by optical action (CD-ROM, DVD, etc.). The communication interface 1006 may transmit and receive data via a network according to instructions from the CPU 1001. The input/output device 1007 includes a device that receives instructions from a user, a device that outputs a decision result, etc.

The error detection program according to the embodiments is provided to the computer system 1000, for example, in the following form.
(1) installed in advance in the storage 1003.
(2) provided by the removable recording medium 1005.
(3) provided from a program server 1010.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An error detection device comprising:
    a code sequence generator configured to generate an input code sequence from a signal that repeatedly transmits a code sequence that includes data, an error detection code, and an error correction code;
    a decoding-target code sequence generator configured to generate a decoding-target code sequence that includes recovered data, an error detection code, and an error correction code from the input code sequence;
    an error corrector configured to generate a corrected code sequence by executing an error correction process that uses the error correction code in the decoding-target code sequence on the decoding-target code sequence;
    an error detector configured to decide whether or not the recovered data in the corrected code sequence includes an error by using the error detection code in the decoding-target code sequence;
    a reference code sequence generator configured to generate a reference code sequence that is obtained by adding to the corrected code sequence a corresponding error correction code, or a reference code sequence that is obtained by adding to the recovered data a corresponding error detection code and a corresponding error correction code, when the error detector decides that the recovered data includes no errors; and
    a verification unit configured to verify whether or not a decision that is made by the error detector is correct according to a comparison result between the reference code sequence and a sequence of a corresponding area in the input code sequence.

2. The error detection device according to claim 1, wherein the decoding-target code sequence generator generates the decoding-target code sequence by making a majority decision for each bit on a plurality of code sequences that are extracted from the input code sequence.

3. The error detection device according to claim 1, wherein the code sequence that is transmitted by the signal further includes a synchronization code, and
    the decoding-target code sequence generator generates the decoding-target code sequence by using the synchronization code.

4. The error detection device according to claim 1, wherein the verification unit decides that a decision that is made by the error detector is correct when a bit match ratio between the reference code sequence and a sequence of a corresponding area in the input code sequence is higher than a threshold value that is specified in advance.

5. The error detection device according to claim 1, wherein the decoding-target code sequence generator generates the decoding-target code sequence by using an entirety of the input code sequence, and
    the verification unit verifies whether or not a decision that is made by the error detector is correct according to a comparison result between the reference code sequence and the entirety of the input code sequence.

6. The error detection device according to claim 1, wherein the decoding-target code sequence generator generates the decoding-target code sequence by using part of the input code sequence, and
    the verification unit verifies whether a decision that is made by the error detector is correct according to a comparison result between the reference code sequence and the other area of the input code sequence.

7. An error detection method comprising:
    generating an input code sequence from a signal that repeatedly transmits a code sequence that includes data, an error detection code, and an error correction code;
    generating a decoding-target code sequence that includes recovered data, an error detection code, and an error correction code from the input code sequence;
    generating a corrected code sequence by executing an error correction process that uses the error correction code in the decoding-target code sequence on the decoding-target code sequence;
    deciding whether or not the recovered data in the corrected code sequence includes an error by using the error detection code in the decoding-target code sequence;
    generating a reference code sequence that is obtained by adding to the corrected code sequence a corresponding error correction code, or a reference code sequence that is obtained by adding to the recovered data a corresponding error detection code and a corresponding error correction code, when it is decided that the recovered data includes no errors; and
    verifying whether or not a decision result for the recovered data is correct according to a comparison result between the reference code sequence and a sequence of a corresponding area in the input code sequence.

8. A non-transitory computer-readable recording medium having stored therein a program for causing a computer to execute an error detection process, the process comprising:
    generating an input code sequence from a signal that repeatedly transmits a code sequence that includes data, an error detection code, and an error correction code;

generating a decoding-target code sequence that includes recovered data, an error detection code, and an error correction code from the input code sequence;

generating a corrected code sequence by executing an error correction process that uses the error correction code in the decoding-target code sequence on the decoding-target code sequence;

deciding whether or not the recovered data in the corrected code sequence includes an error by using the error detection code in the decoding-target code sequence;

generating a reference code sequence that is obtained by adding to the corrected code sequence a corresponding error correction code, or a reference code sequence that is obtained by adding to the recovered data a corresponding error detection code and a corresponding error correction code, when it is decided that the recovered data includes no errors; and verifying whether or not a decision result for the recovered data is correct according to a comparison result between the reference code sequence and a sequence of a corresponding area in the input code sequence.

* * * * *